(12) United States Patent
Ramappa et al.

(10) Patent No.: US 7,767,583 B2
(45) Date of Patent: Aug. 3, 2010

(54) METHOD TO IMPROVE UNIFORMITY OF CHEMICAL MECHANICAL POLISHING PLANARIZATION

(75) Inventors: Deepak Ramappa, Cambridge, MA (US); Thirumal Thanigaivelan, North Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/331,937

(22) Filed: Dec. 10, 2008

(65) Prior Publication Data

US 2009/0227087 A1  Sep. 10, 2009

Related U.S. Application Data

(60) Provisional application No. 61/033,538, filed on Mar. 4, 2008, provisional application No. 61/049,971, filed on May 2, 2008.

(51) Int. Cl.
*H01L 21/302* (2006.01)
(52) U.S. Cl. .................... 438/705; 438/407; 438/423; 438/440; 438/480; 438/514; 438/515; 438/516; 438/517; 438/518; 438/519; 438/520; 438/528; 438/659; 438/766
(58) Field of Classification Search .............. 438/407, 438/423, 440, 480, 514–520, 528, 659, 705, 438/766
See application file for complete search history.

(56) References Cited

U.S. PATENT DOCUMENTS

| 4,502,206 | A | 3/1985 | Schnable et al. |
|---|---|---|---|
| 4,704,367 | A | 11/1987 | Alvis et al. |
| 4,942,138 | A | 7/1990 | Miki |
| 6,117,770 | A | 9/2000 | Pramanick et al. |
| 6,146,973 | A * | 11/2000 | He et al. ............. 438/433 |
| 6,245,635 | B1 * | 6/2001 | Lee ..................... 438/407 |
| 6,461,967 | B2 * | 10/2002 | Wu et al. ............. 438/705 |
| 6,593,233 | B1 | 7/2003 | Miyazaki et al. |
| 6,977,204 | B1 * | 12/2005 | Joo .................... 438/430 |
| 7,033,919 | B1 * | 4/2006 | Yu et al. ............. 438/595 |
| 7,312,153 | B2 | 12/2007 | Coletti et al. |
| 7,315,084 | B2 * | 1/2008 | Fujii .................. 257/762 |
| 7,544,957 | B2 | 6/2009 | Walther et al. |
| 2002/0115292 | A1 | 8/2002 | Andricacos et al. |
| 2005/0191828 | A1 | 9/2005 | Al-Bayati et al. |
| 2006/0046370 | A1 * | 3/2006 | Oh et al. ............. 438/199 |
| 2006/0240651 | A1 | 10/2006 | Renau et al. |
| 2006/0286797 | A1 * | 12/2006 | Zhang et al. ......... 438/659 |
| 2007/0042580 | A1 | 2/2007 | Al-Bayati et al. |
| 2007/0161199 | A1 * | 7/2007 | Morita ................. 438/311 |
| 2008/0121278 | A1 | 5/2008 | Ito et al. |
| 2008/0286952 | A1 * | 11/2008 | Miyairi et al. ......... 438/517 |

FOREIGN PATENT DOCUMENTS

| JP | 8203900 A | 8/1996 |
|---|---|---|
| JP | 2004214400 A | 7/2004 |

\* cited by examiner

*Primary Examiner*—Kevin M Picardat
*Assistant Examiner*—Bac H Au (57) ABSTRACT

Embodiments of this method improve the results of a chemical mechanical polishing (CMP) process. A surface is implanted with a species, such as, for example, Si, Ge, As, B, P, H, He, Ne, Ar, Kr, Xe, and C. The implant of this species will at least affect dishing, erosion, and polishing rates of the CMP process. The species may be selected in one embodiment to either accelerate or decelerate the CMP process. The dose of the species may be varied over the surface in one particular embodiment.

15 Claims, 13 Drawing Sheets

METHOD TO IMPROVE UNIFORMITY OF CHEMICAL MECHANICAL POLISHING PLANARIZATION

CROSS-REFERENCE TO RELATED APPLICATIONS

This application claims priority to the provisional patent application entitled "Method to Improve Uniformity of CMP Planarization," filed Mar. 4, 2008 and assigned U.S. App. No. 61/033,538 and the provisional application entitled "Method to Improve Uniformity of CMP Planarization," filed May 2, 2008 and assigned U.S. App. No. 61/049,971, the disclosures of which are hereby incorporated by reference.

FIELD

This invention relates to ion implantation, and, more particularly, to ion implantation to improve the results of a chemical mechanical polishing process.

BACKGROUND

Chemical mechanical polishing (CMP) is widely used in integrated circuit (IC) manufacturing as a method of removing material to enable the planarization of a surface of the IC. This planarization may enable accurate photolithography or improve other IC processing steps. The CMP process may involve two aspects: a chemical reaction and a physical abrasion of material. To remove material, the CMP process may use a polishing pad in a polishing apparatus. The polishing pad or the workpiece may be rotated during this CMP process. In one instance, the workpiece surface is brought into contact with a rotating pad saturated with at least one of a slurry of abrasive particles or a reactive solution that will chemically react with features on the workpiece surface. In one instance, this may be performed while exerting a force between the workpiece and polishing pad.

CMP is used for planarization, feature formation, or damascene interconnect formation. Planarization may include an oxide CMP of the pre-metal dielectric (PMD) before the formation of any contacts. Feature formation may include shallow trench isolation (STI) formation. Damascene interconnect formation may include tungsten "plug" contact formation or copper "trench" or "via" interconnect formation. In one particular example, copper metal, including the "overburden," or excess material, is deposited by electroplating and annealed prior to a CMP process. The anneal is performed to initiate grain growth of the copper because large grain growth may reduce copper resistivity. The location of the copper may affect grain size, or the average grain diameter. The "overburden" tends to grow large grains where it is unrestricted structurally. But the copper in the trenches and vias is structurally limited, so it will grow smaller grains. Thus, large grain size of the copper on or in the trenches and vias may be induced through an anneal.

Figure 1:
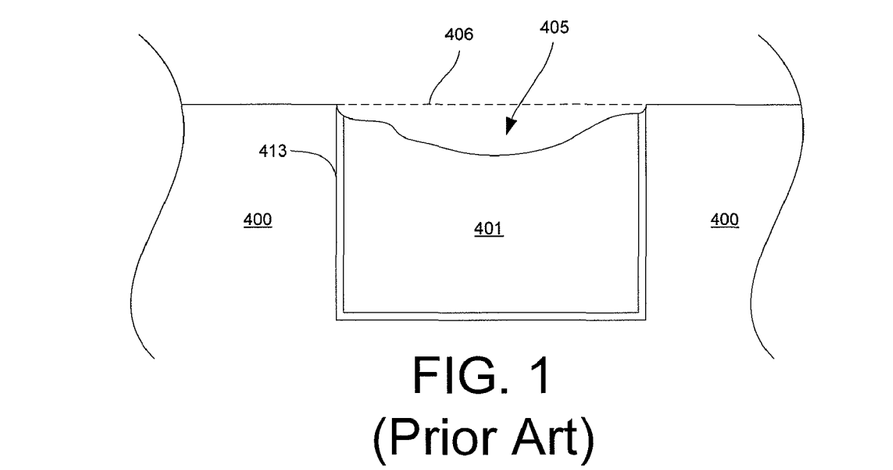
FIG. 1 is a cross-sectional view of a metal layer where localized dishing has occurred to illustrate a drawback of the prior art.

CMP processes have several shortcomings. First, localized dishing may occur. FIG. 1 is a cross-sectional view of a metal layer where localized dishing has occurred to illustrate a drawback of the prior art. The metal layer 401, which may be copper, tungsten, or some other metal, is disposed in layer 400. This layer 400 may be an interlayer dielectric (ILD) or intermetal dielectric (IMD), such as, for example, silicon oxide. The layer 400 also may be a low-k dielectric such as Si—O—C. The layer 400 and metal layer 401 will polish differently due to the difference in the properties of each.

Furthermore, during a CMP process, two different metals may be polished at the same time. A metal, such as tantalum or a nitride, may be used as a liner or diffusion barrier 413 for the metal layer 401. The liner or diffusion barrier 413 may be needed to prevent the metal in the metal layer 401 from diffusing into the layer 400. During the CMP process, the metal layer 401 and liner or diffusion barrier 413 may be polished at the same time. The difference in density and hardness of each material will cause the polish rate to vary with each material. The metal layer 401 will preferentially polish. This may cause excessive copper to be removed from the metal layer 401, creating a cavity 405 compared to an ideal surface represented by the line 406 and reducing the effective metal layer 401 thickness.

Figure 2:
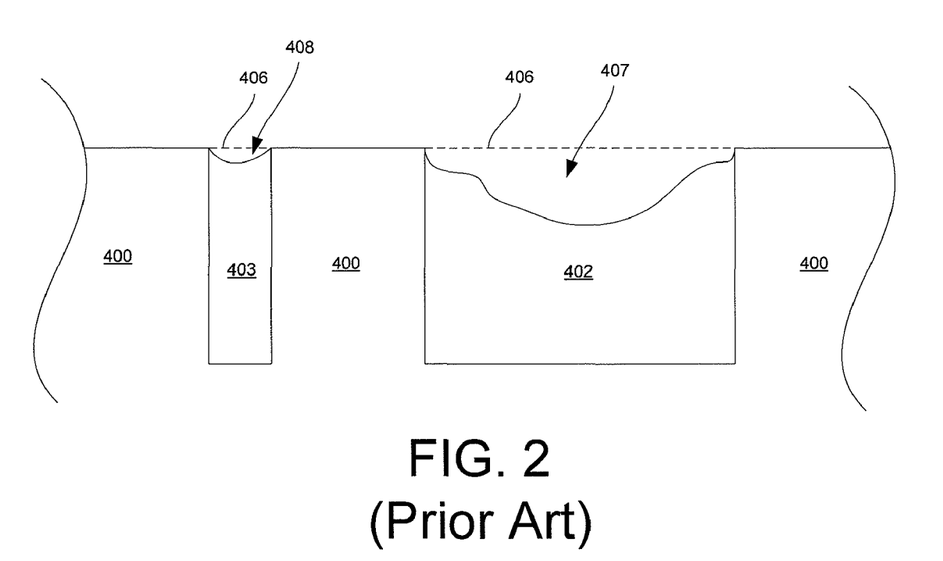
FIG. 2 is a cross-sectional view of a metal layer where dishing has occurred to illustrate a drawback of the prior art.

Second, dishing or microloading may occur. FIG. 2 is a cross-sectional view of a metal layer where dishing has occurred to illustrate a drawback of the prior art. Metal layer 402 is wider compared to metal layer 403. Both metal layer 402 and 403 are copper in this instance, but also may be other metals. Wide metal lines, such as metal layer 402, polish more than narrow metal lines, such as metal layer 403, causing more metal to be removed from wide metal areas and rendering it thinner. Wider metal lines, such as metal layer 402, have larger grains because these metal lines are less restricted structurally by the trench or via compared to narrow metal lines, such as metal layer 403. A CMP process on metal layers with smaller grains may involve the slurry chemistry attacking the higher density grain boundaries or the interface between two different metals. A CMP process on metal layers with larger grains may involve the slurry acting as an abrasive. Thus, wider metal lines with larger grains, such as metal layer 402, tend to polish at a different or faster rate than the narrower metal lines, such as metal layer 403. A larger cavity 407 will form compared to an ideal surface represented by line 406 in wider metal layer 402 compared to the cavity 408 for narrower metal layer 403. With all else being equal, the wider metal lines, such as metal layer 402, with larger grains will dish more.

Figure 3:
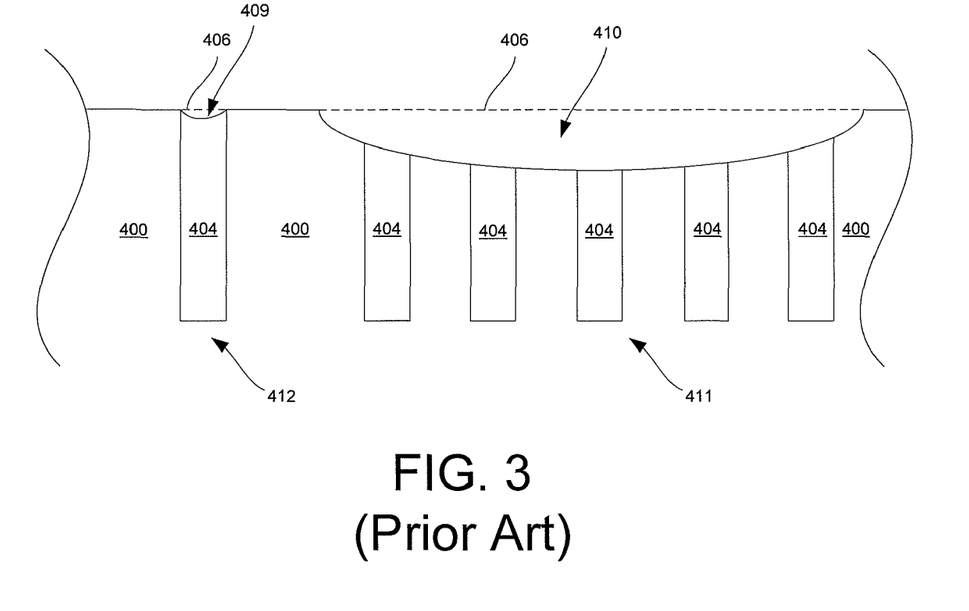
FIG. 3 is a cross-sectional view of a metal layer where erosion has occurred to illustrate a drawback of the prior art.

Third, erosion may occur. FIG. 3 is a cross-sectional view of a metal layer where erosion has occurred to illustrate a drawback of the prior art. The loading effect of a CMP process will polish dense areas, such as region 411 of metal lines 404, at different rates than isolated features, such as region 412 of metal lines 404. Metal lines 404, which may be copper or some other metal, and layer 400, which may be an ILD or IMD, is removed or polished more during a CMP process if the metal lines 404 are densely situated because denser areas are more prone to erosion. Therefore, a larger cavity 410 will form compared to an ideal surface represented by line 406 in region 411 than the cavity 409 for region 412.

Fourth, a CMP process tends to have a faster polish rate or to polish more at the center of a workpiece than at an edge of a workpiece due to the way the CMP process is performed. The edge of the polishing pad may compress differently than the center of the polishing pad, causing leading edge thickness variations in the workpiece. For example, during oxide polishing, the edges of the workpiece will be polished at a slower rate or will be polished less than the center of the workpiece. This is typically compensated for by a counter profile during a chemical vapor deposition (CVD) process or an electroplating process for metal deposition.

CMP processes that are performed on metals have many drawbacks. While these examples specifically discuss copper, other metals and materials, such as dielectrics, suffer from similar problems. With the advent of scaling, the problems caused by CMP processes, such as dishing, recess, erosion, or CMP non-uniformities, become more detrimental because of the sensitivity of resistance to the thickness of a metal.

First, the results of a CMP process are not uniform across a workpiece. Rather, there are variations between dies after a CMP process. This means there will be reliability differences between different dies on the same workpiece. Certain ICs subject to a CMP process may even fail due to the results of the CMP process. Furthermore, a single CMP process may cause approximately 2-4% yield loss and sometimes up to 20% non-conformity loss due to these problems. Yield loss is a determination of whether dies on a wafer are "good" or "bad." The "good" dies are considered part of the yield. Conformity loss is any error in an IC that does not give the desired shape or form. For example, if a cross-section of a dielectric is supposed to be planar, but after a CMP process has dishing, then the IC is a conformity loss.

Accordingly, there is a need in the art for a process to address the above-described inadequacies and shortcomings and, more particularly, an implantation process that will improve the results of a CMP process.

SUMMARY

According to a first aspect of the invention, a method is provided. The method comprises depositing a metal on a surface of a workpiece. At least a portion of the metal is amorphized by implanting a species into the metal. A chemical mechanical polish is performed on an exposed surface of the metal.

According to a second aspect of the invention, a method is provided. The method comprises depositing a layer on a surface of a workpiece. At least a portion of the layer is implanted with a species. A chemical mechanical polish is performed on an exposed surface of the layer.

According to a third aspect of the invention, a method is provided. The method comprises implanting a workpiece with a first species to form a layer of microbubbles in the workpiece. The workpiece is cleaved along the layer of microbubbles to form a cleaved surface. At least a portion of the cleaved surface is implanted with a second species. A chemical mechanical polish is performed on the cleaved surface.

BRIEF DESCRIPTION OF THE DRAWINGS

For a better understanding of the present disclosure, reference is made to the accompanying drawings, which are incorporated herein by reference and in which.

DETAILED DESCRIPTION

Figure 4:
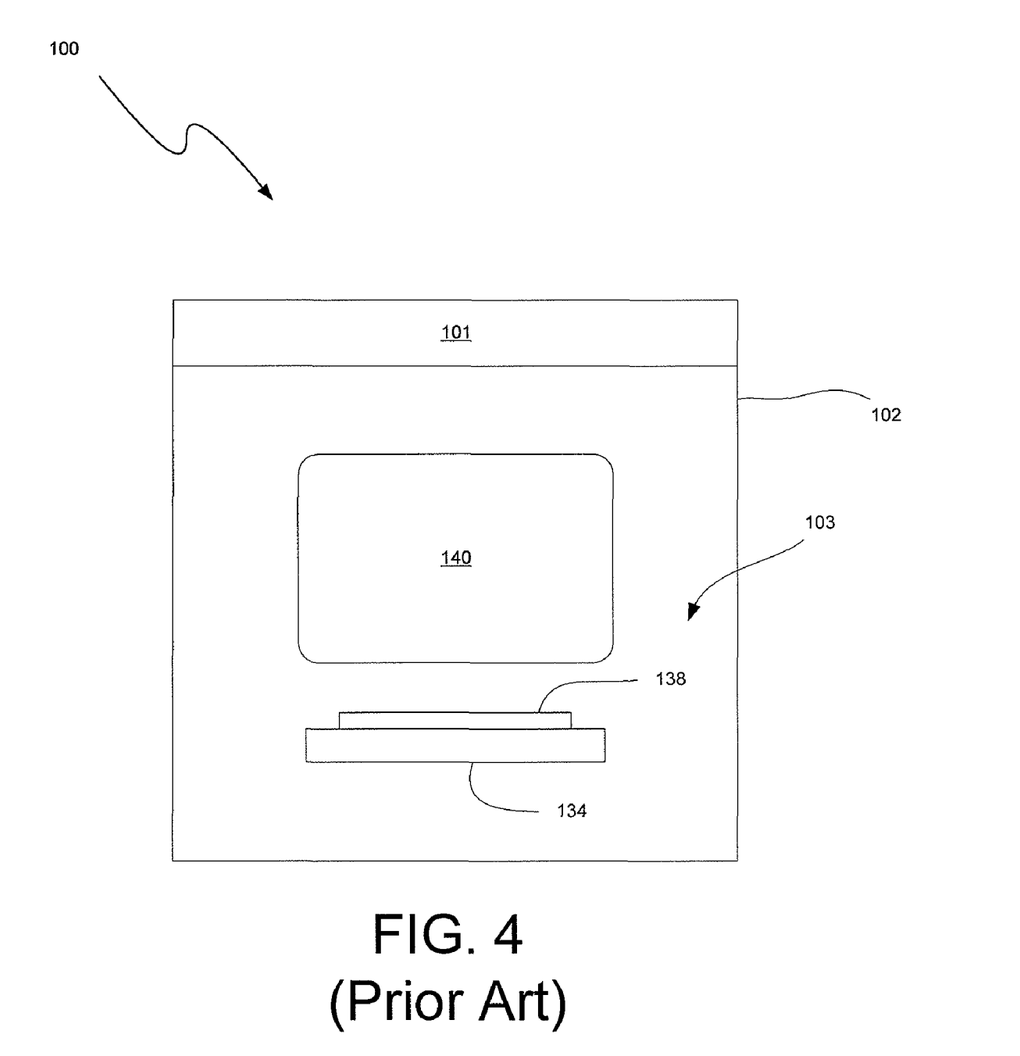
FIG. 4 is a block diagram of a plasma doping system.
Figure 5:
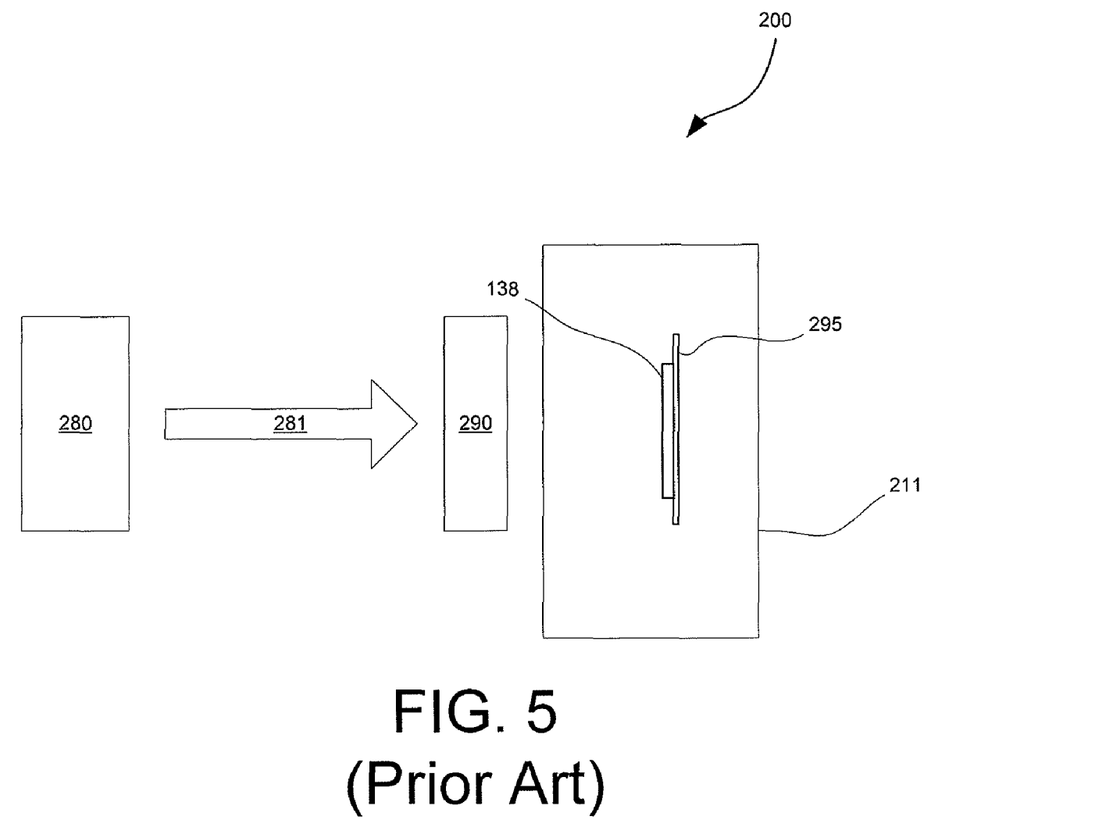
FIG. 5 is a block diagram of a beamline ion implanter.

In one embodiment, the results of a CMP process are improved through ion implantation. This ion implantation may be performed by, for example, a plasma doping system or a beamline ion implanter. FIG. 4 is a block diagram of a plasma doping system 100. FIG. 5 is a block diagram of a beamline ion implanter 200. Those skilled in the art will recognize that the plasma doping system 100 and the beamline ion implanter 200 are each only one of many examples of differing plasma doping systems and beamline ion implanters that can improve the results of a CMP process. This process also may be performed with other ion implantation systems or other workpiece or semiconductor wafer processing equipment. While a silicon workpiece is discussed in many embodiments, this process also may be applied to workpieces composed of SiC, GaN, GaP, GaAs, polysilicon, Ge, quartz, or other materials known to those skilled in the art.

Turning to FIG. 4, the plasma doping system 100 includes a process chamber 102 defining an enclosed volume 103. A platen 134 may be positioned in the process chamber 102 to support a workpiece 138. The platen 134 may be biased using a DC or RF power supply. The platen 134, workpiece 138, or process chamber 102 may be cooled or heated by a temperature regulation system (not illustrated). In one instance, the workpiece 138 may be a semiconductor wafer having a disk shape, such as, in one embodiment, a 300 mm diameter silicon wafer. However, the workpiece 138 is not limited to a silicon wafer. The workpiece 138 could also be, for example, a flat panel, solar, or polymer substrate. The workpiece 138 may be clamped to a flat surface of the platen 134 by electrostatic or mechanical forces. In one embodiment, the platen 134 may include conductive pins (not shown) for making connection to the workpiece 138. The plasma doping system 100 further includes a source 101 configured to generate a plasma 140 within the process chamber 102. The source 101 may be an RF source or other sources known to those skilled in the art. The plasma doping system 100 may further include a shield ring, a Faraday sensor, or other components. In some embodiments, the plasma doping system 100 is part of a cluster tool, or operatively-linked plasma doping chambers within a single plasma doping system 100. Thus, numerous plasma doping chambers may be linked in vacuum.

In operation, the source 101 is configured to generate the plasma 140 within the process chamber 102. In one embodiment, the source is an RF source that resonates RF currents in at least one RF antenna to produce an oscillating magnetic field. The oscillating magnetic field induces RF currents into the process chamber 102. The RF currents in the process chamber 102 excite and ionize a gas to generate the plasma 140. The bias provided to the platen 134, and, hence, the workpiece 138, will accelerate ions from the plasma 140 toward the workpiece 138 during bias pulse on periods. The frequency of the pulsed platen signal and/or the duty cycle of the pulses may be selected to provide a desired dose rate. The amplitude of the pulsed platen signal may be selected to provide a desired energy. With all other parameters being equal, a greater energy will result in a greater implanted depth.

Turning to FIG. 5, a block diagram of a beamline ion implanter 200 is illustrated. Again, those skilled in the art will recognize that the beamline ion implanter 200 is only one of many examples of beamline ion implanters that can provide ions. In general, the beamline ion implanter 200 includes an ion source 280 to generate ions that are extracted to form an ion beam 281, which may be, for example, a ribbon beam or a spot beam. The ion beam 281 may be mass analyzed and converted from a diverging ion beam to a ribbon ion beam with substantially parallel ion trajectories in one instance. The beamline ion implanter 200 may further include an acceleration or deceleration unit 290 in some embodiments.

An end station 211 supports one or more workpieces, such as workpiece 138, in the path of the ion beam 281 such that ions of the desired species are implanted into workpiece 138. In one instance, the workpiece 138 may be a semiconductor wafer having a disk shape, such as, in one embodiment, a 300 mm diameter silicon wafer. However, the workpiece 138 is not limited to a silicon wafer. The workpiece 138 could also be, for example, a flat panel, solar, or polymer substrate. The end station 211 may include a platen 295 to support the workpiece 138. The end station 211 also may include in one embodiment a scanner (not shown) for moving the workpiece 138 perpendicular to the long dimension of the ion beam 281 cross-section, thereby distributing ions over the entire surface of workpiece 138.

The ion implanter 200 may include additional components known to those skilled in the art such as automated workpiece handling equipment, Faraday sensors, or an electron flood gun. It will be understood to those skilled in the art that the entire path traversed by the ion beam is evacuated during ion implantation. The beamline ion implanter 200 may incorporate hot or cold implantation of ions in some embodiments.

Use of ion implantation may overcome the limitations and drawbacks of using CMP. This ion implantation, such as by the plasma doping system 100 or the beamline ion implanter 200, may be performed before or during the CMP step or CMP steps and may be used to improve the results of a CMP process on metals including, for example, copper. Ion implantation will, however, also improve the results of a CMP process on other metals or conductors. In one particular embodiment, the ion implantation will amorphize, or cause the material crystal lattice to become disordered or irregular, a portion of the deposited and annealed copper on the surface of the metal layers. An amorphous material has a noncrystalline structure. Because the ion implantation process does not have a microloading effect, or a difference between isolated features and a dense array of features, the nature and depth of amorphization are independent of feature size, density, or depth.

The amorphization process may eliminate the grain size dependency of the polish rates and improve the hardness of copper to reduce copper erosion. CMP is dependent on grain size because during a CMP process the slurry chemistry may attack the grain boundaries in a smaller grain size and may act as an abrasive with a larger grain size. If the copper is amorphized, it will not have a grain size because grain size is found in crystalline material. The degree of amorphization or the percent of a surface that is amorphized also may affect the CMP process. A more amorphous surface may further improve the results of a CMP process, for example. This may affect or improve the results of other polishing methods as well.

Figure 6:
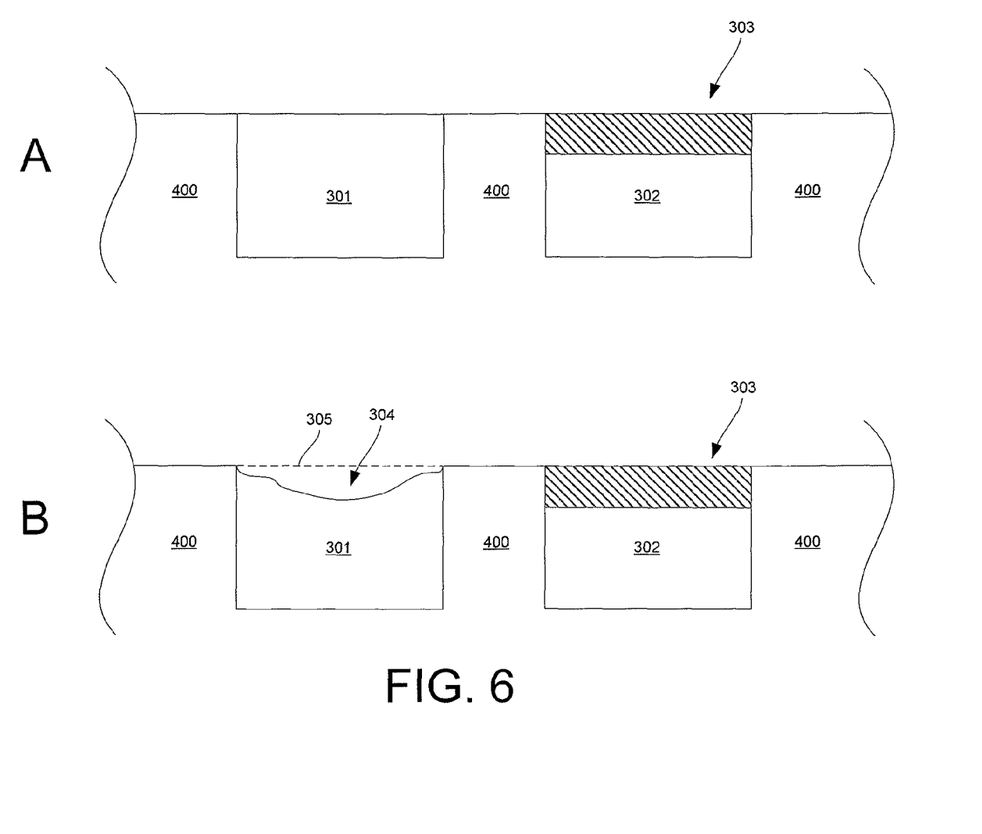
FIGS. 6A-6B are cross-sectional views of a metal layer before and after a CMP process.

FIGS. 6A-6B are cross-sectional views of a metal layer before and after a CMP process. FIG. 6A is prior to a CMP process. Metal layer 301 and metal layer 302 are located in the layer 400. While the metal layer 301 and metal layer 302 are illustrated adjacent one another for comparison, the metal layer 301 and metal layer 302 may be located on different workpieces or in different portions of a workpiece. At least part of the metal layer 302 is amorphized, represented by region 303. FIG. 6B is after a CMP process. The presence of the amorphized region 303 will improve the results of the CMP process for metal layer 302 compared to metal layer 301. The metal layer 301 will have a cavity 304 formed compared to the ideal profile represented by line 305.

Using the energy control of ion implantation, the depth to which the copper is amorphized and, thus, the degree of copper dishing also can be controlled. If an implant depth is too shallow, the results of the CMP process may still have dishing present because at least part the amorphized region of the copper is removed during the CMP process. This leaves only the non-amorphized copper to be subject to the CMP process. Therefore, if all of a copper region that is removed during a CMP process is amorphized, then dishing can be completely controlled. If only part of the copper that is removed during a CMP process is amorphized, then some dishing may occur. There may be less dishing in this instance than if none of the copper is amorphized.

The energy of the ion implantation varies with the desired depth of the implant. For example, the copper may only be implanted in a shallow region near the surface of the metal layers 302 that is affected by the CMP process, such as region 303. In another example, the copper is implanted to a deeper depth, such as to the base of the metal layer 302. The layer 400 also may be implanted in some embodiments.

For example, the energy required for an implant into a dielectric may be between approximately 5 to 40 keV. The energy required for an implant into a metal varies depending on what stage the metal is at in a CMP process. If an implant is performed at least partially or halfway through the CMP process, lower energies are required because part of the metal has already been removed in the CMP process and less implant depth may be needed. The dose of the implants may be between approximately 1E14 and 1E16.

Ion implantation may improve the results of a CMP process and improve performance of a device. Resulting metal line recesses and dishing may be reduced and, therefore, line resistance and resistance variation may be improved. Metal line resistance is an inverse function of metal thickness and, therefore, thickness variation caused by non-uniform CMP process results will cause resistance variation. Furthermore, erosion due to the CMP process, microloading, or density, size, and area dependency of a CMP process also may be reduced.

Precise amorphizing implants that are implanted to certain depths may be used to help with electromigration and improve the results of the CMP process. Precise amorphization allows grains in the metal to be removed. Grain boundaries between different grains in the metal lack the symmetry of a normal crystal lattice. Electrons flowing through the grain boundaries will transfer momentum to the atoms in the crystal lattice of the grain boundaries more strongly because these are not symmetrical. Removing the grains from the metal through amorphization will reduce the number of atoms knocked out by the flowing electrons because the momentum transferred to the atoms will be lessened, thus reducing electromigration. Furthermore, amorphization of only certain depths or only certain regions prevents contamination of non-metal areas.

Lastly, amorphizing the metal surface also may improve metal surface adhesion with a subsequently deposited passivation layer or etch stop, such as SiN. Some passivation layers or etch stops are amorphous and dielectric. Metal-dielectric interface adhesion is improved if the metal is amorphized because stress is reduced, wettability is improved, and surface area is increased.

Figure 7:
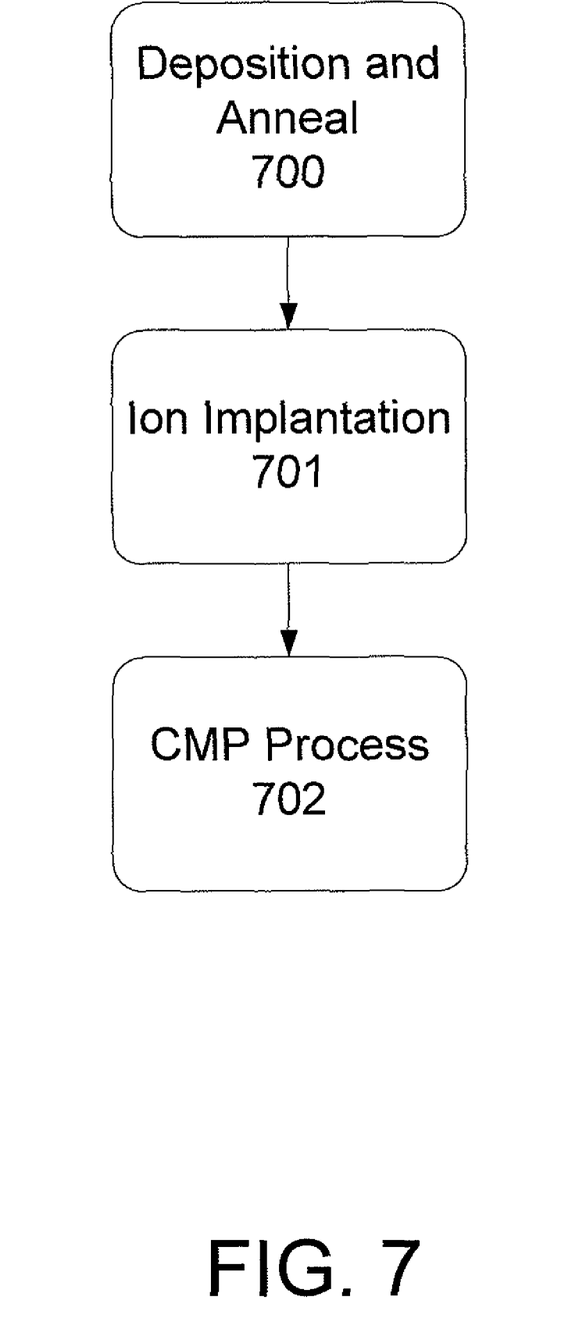
FIG. 7 is a flow diagram of a first embodiment of ion implantation to improve the results of a CMP process.

FIG. 7 is a flow diagram of a first embodiment of ion implantation to improve the results of a CMP process. In this particular embodiment, the structure subject to ion implantation includes a copper layer. However, other structures, metals, or conductors may be used in this process. In this embodiment, ion implantation 701 of the copper occurs after copper deposition and anneal 700 but prior to any CMP process 702. The implant depth may vary. In one embodiment, the implant depth is selected to be just above any barrier layer or dielectric layer of the structure such that only the copper overburden is implanted. In another embodiment, the implant depth is selected to be below any barrier layer or dielectric layer of the structure.

Following the ion implantation, the CMP process 702 occurs. This CMP process 702 may in one instance involve multiple stages or may occur in multiple steps. As explained herein, the presence of amorphous copper during the CMP process 702 will help reduce dishing and reduce erosion of copper features in the structure.

Figure 8:
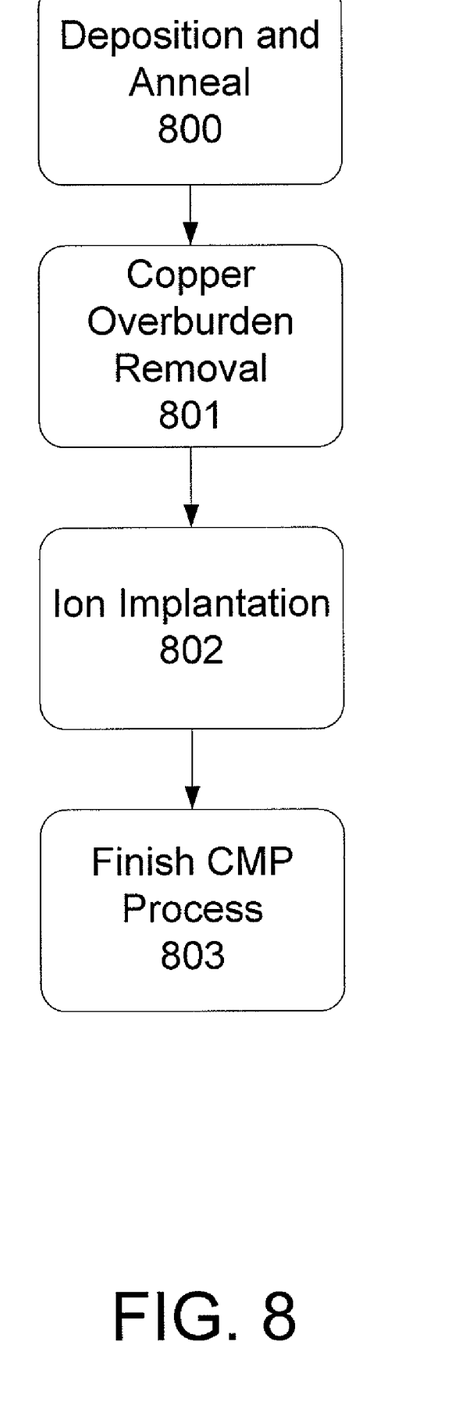
FIG. 8 is a flow diagram of a second embodiment of ion implantation to improve the results of a CMP process.

FIG. 8 is a flow diagram of a second embodiment of ion implantation to improve the results of a CMP process. In this particular embodiment, the structure subject to ion implantation includes a copper layer. However, other structures, metals, or conductors may be used in this process. In this embodiment, ion implantation 802 of the copper occurs after copper deposition and anneal 800 and after at least some of the copper overburden is removed 801, but prior to finishing the CMP process 803. The copper overburden may be removed by CMP or, for example, by electrolytic CMP (E-CMP). E-CMP is a reverse electroplating process where copper is dissolved from the surface into an electroplating bath. Following the ion implantation 802, finishing the CMP process 803 occurs. Finishing the CMP process 803 may in one instance involve multiple stages or may occur in multiple steps. The presence of amorphous copper during the CMP process 803 will help reduce dishing and reduce erosion of copper features in the structure.

In the particular embodiment of FIG. 8, the amorphizing ion implant 802 is such that only an insubstantial implant of the dielectric materials between the copper features may occur. Since a barrier metal, or material surrounding the copper, is denser and harder than copper, the implanted range will be shallower in the barrier metal than the copper. Thus, an implant at a particular energy will implant deeper into the copper than the barrier metal or material around the copper. The implant into the barrier metal or material around the copper may be shallow. For example, in FIG. 6A, the region 303 is implanted deeper than the surface of the layer 400. The barrier metal, as seen in, for example, FIG. 1, may be Ta, TaN, or TiN and will act as a mask to any implanted ions and prevent these ions from reaching the dielectric layer. The thickness of the amorphized region within the copper features will be configured to improve the uniformity of results of the later stages in the CMP process. For example, the thickness of the amorphized region may be at least as deep as the thickness of material removed during the CMP process to improve uniformity of the results.

In other embodiments, ion implantation occurs at later points in the CMP process. Embodiments of the process described herein are not limited solely to the methods illustrated in FIGS. 7 and 8.

In the embodiments of FIGS. 7 and 8, the ion species may be, for example, Si, Ge, Ar, As, He, H, B, P, C, another noble gas, or a molecular species that includes C, B, and H, such as carborane $C_2B_{10}H_{11}$. The ion species also may be a cluster carbon molecule, a large molecular species, or another species. The energies used during implant may be dependent on the species selected and the desired implant depth. For example, the overburden of copper may be approximately 5-6 µm for 45 nm logic structures. The copper overburden thickness remaining after the copper overburden is mostly removed during a CMP process may be approximately 50 nm. Ta and TaN have about 0.5 parasitic resistance (Rp) of the range in copper. These species also are applicable to other implants that can improve the results of a CMP process.

The implant may be performed at room temperature or, in some embodiments, may be a heated or cooled implant. Higher or lower temperatures may improve implant depth by changing the distance between atoms in the crystal lattice or the amorphization quality. For example, a cold implant may be beneficial because cooler implants can increase amorphization depth at a lower dose. Lower workpiece temperatures will lower the threshold where a species can amorphize the workpiece and also may improve the amorphization quality. Amorphization quality is improved at lower temperatures because the crystal lattice of the workpiece may be closer together compared to the crystal lattice at a higher temperature. Cold implants also may lower the required dose to amorphize because the amorphization threshold is lowered. So a cold implant may improve amorphization quality because more amorphization will occur at a given dose.

Furthermore, any residual amorphized region left on the surface of the copper features in these embodiments also may improve electromigration. The amorphous surface of the copper also may have better adhesion with a passivation layer or etch stop, such as a nitride. Thus, implant species may be selected to both improve uniformity of a CMP process and to improve electromigration and adhesion.

Figure 9:
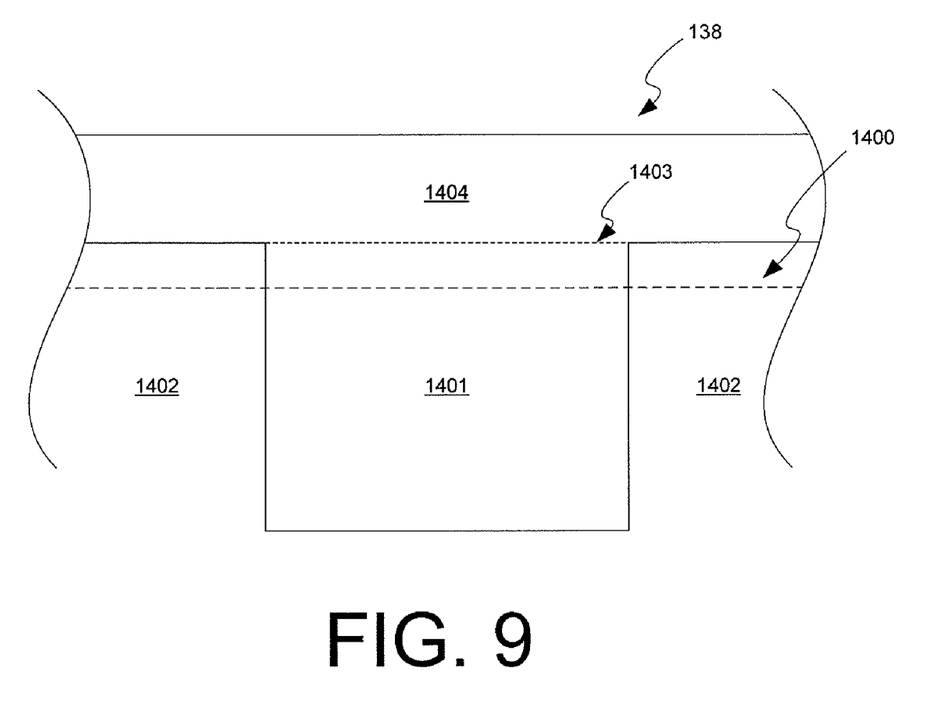
FIG. 9 illustrates a copper layer that has been implanted with a species.

By implanting a dopant species, such as B, P, or As, the implant could improve the results of a CMP process and also dope a copper layer. FIG. 9 illustrates a copper layer that has been implanted with a species. The copper layer 1401 and overburden 1404 of the workpiece 138 has been implanted with a dopant species, such as B, P, or As, in the implanted region that extends to line 1400. The excess or overburden 1404 will be removed down to line 1403 during a CMP process. This leaves part of implanted region that extends to line 1400. Thus, part of the workpiece 138 may be doped while improving the results of the CMP process. The dielectric 1402 also may be doped with the species. While FIG. 9 illustrates that the dielectric 1402 is doped to the same depth as the copper layer 1401, in another instance the implant depth into the dielectric 1402 is different from that of the copper layer 1401. If the dielectric 1402 is doped, reactivity in the dielectric 1402 or the wet etch rate of the dielectric 1402 in a slurry may be reduced. In another embodiment, a species, such as C, is implanted into the copper layer 1401 and dielectric 1402. Implanting carbon into the dielectric 1402 may reduce the dielectric constant, or k-value, of the dielectric 1402.

As stated above, other metals may benefit from this ion implantation process. For example, this process may be applied to tungsten. However, the process may be applied to other specialized CMP processes, such as those for crystals, dielectrics, or polymers. The amorphization caused by ion implantation will affect at least dishing, erosion, and polishing rates.

Figure 10:
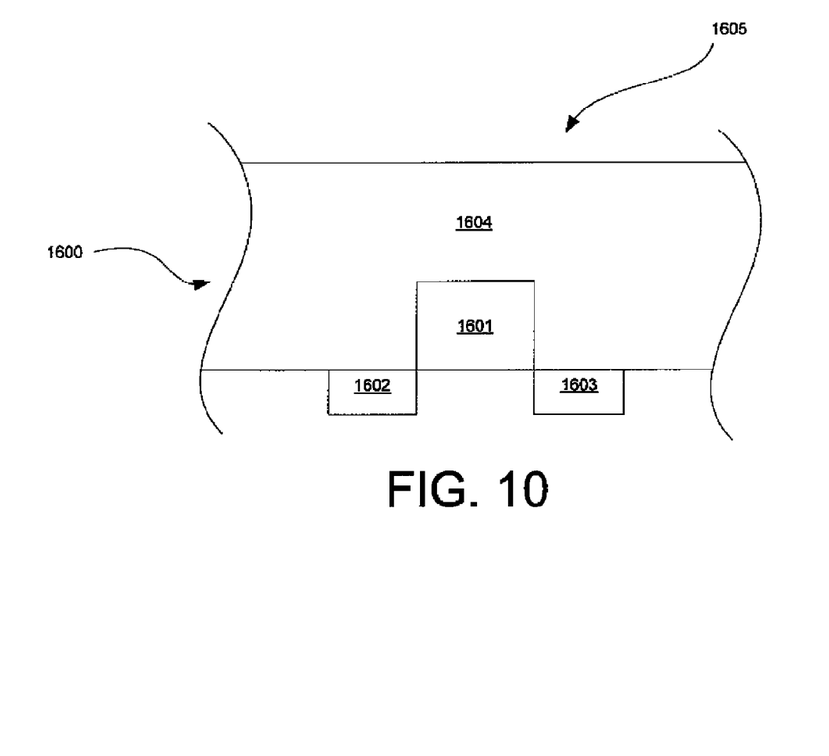
FIG. 10 is a cross-sectional view of a PMD that is implanted to improve the results of a CMP process.

In one embodiment, this ion implantation process may be applied to a PMD. FIG. 10 is a cross-sectional view of a PMD that is implanted to improve the results of a CMP process. The PMD 1600 includes a poly layer 1601, a source 1602, and a drain 1603. The poly layer 1601 may be a gate in one instance. The PMD 1600 also includes a layer 1604, which may be a dielectric or oxide. PMD 1600 may have other designs than that illustrated in FIG. 10 and is not solely limited to the embodiment illustrated in FIG. 10. During the CMP process, the layer 1604 will be polished. Implantation of ions into at least the surface 1605 of the layer 1604 will improve the results of a CMP process. The surface 1605 of the layer 1604 may be amorphized in some embodiments. It will affect at least dishing, erosion, and polishing rates.

Figure 11:
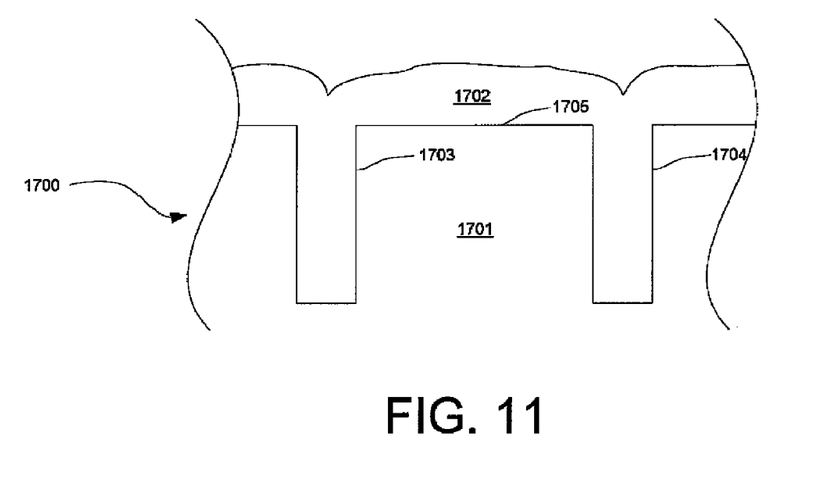
FIG. 11 is cross-sectional view of a STI that is implanted to improve the results of a CMP process.

In another embodiment, this ion implantation process may be applied to STI. FIG. 11 is cross-sectional view of a STI that is implanted to improve the results of a CMP process. The STI 1700 includes a structure 1701 that, in this embodiment, has two trenches 1703, 1704. These trenches 1703, 1704 and the surface 1705 of the structure 1701 are covered in a layer 1702, which may be a dielectric or an oxide. STI 1700 may have other designs than that illustrated in FIG. 11 and is not solely limited to the embodiment illustrated in FIG. 11. During the CMP process, the layer 1702 will be polished down to the surface 1705 of the STI 1700 such that only the trenches 1703, 1704 are filled with the layer 1702. Implantation of the layer 1702 will improve the results of a CMP process. The layer 1702 may be amorphized in some embodiments. It will affect at least dishing, erosion, and polishing rates.

This implanted layer illustrated in FIGS. 10 and 11 may be any crystal or any dielectric, such as, for example, an oxide, carbide, or nitride. Thus, this process is not limited solely to oxides, nitrides, or carbides.

Figure 12:
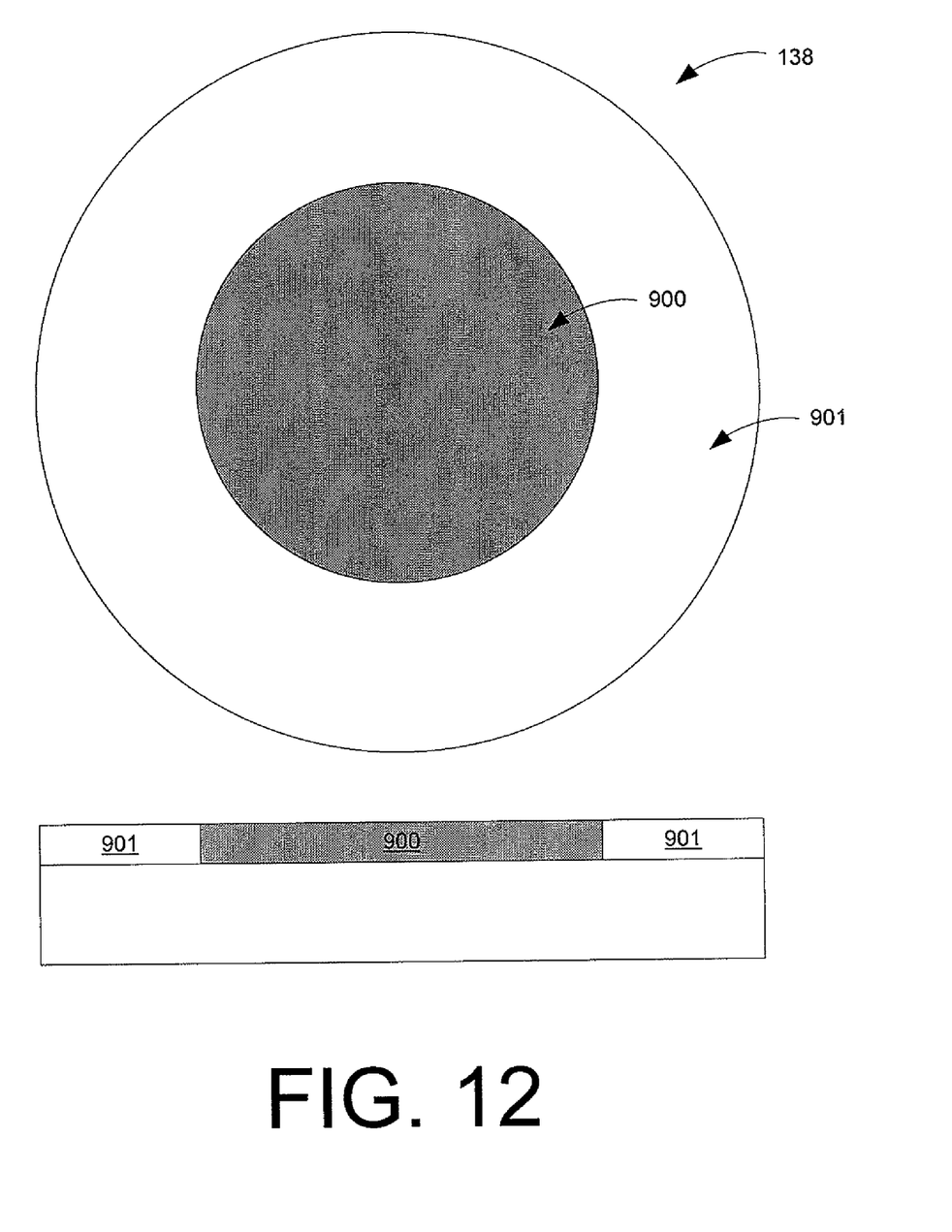
FIG. 12 is plan and corresponding cross-sectional view of an embodiment of varying an implant dose over a workpiece.

In another embodiment, the implant dose is varied such that the center of the workpiece is implanted more than the edges. The center of the workpiece is usually polished more during a CMP process than the edges because the edge of the polishing pad may be compressed differently than the center of the polishing pad. FIG. 12 is plan and corresponding cross-sectional view of an embodiment of varying an implant dose over a workpiece. The center region 900 of the workpiece 138 is implanted with a higher dose than the edge region 901 of the workpiece 138. The ion dose, scan speed, scan pattern, beam current, or beam energy of the implant may be varied during the implantation to form the center region 900 and the edge region 901. Other patterns of varying dose across the workpiece 138, such as a dose that forms a gradient from high to low across the width of the workpiece 138 or from the center to the edge of the workpiece 138, also are possible.

In other embodiments, both sides of a workpiece may be implanted to improve the results of a CMP process. In this particular embodiment, both sides of the workpiece are polished. In one particular embodiment, both sides of the workpiece are polished simultaneously.

Ion implantation also may allow the polishing rate during a CMP process to be increased or decreased. By implanting a surface, the polishing rate can be performed at an accelerated or decelerated rate compared to a CMP process where the workpiece is not implanted. If polishing is accelerated, the CMP process will take less time and will use less slurry. In one specific example, accelerating a CMP process after implantation will reduce slurry use by 10%. In one embodiment to accelerate polishing during a CMP process, a species such as B, P, As, or another active dopant is implanted into a surface. In another embodiment to decelerate polishing during a CMP process, an inert gas such as H or a noble gas is implanted into a surface.

Figure 13:
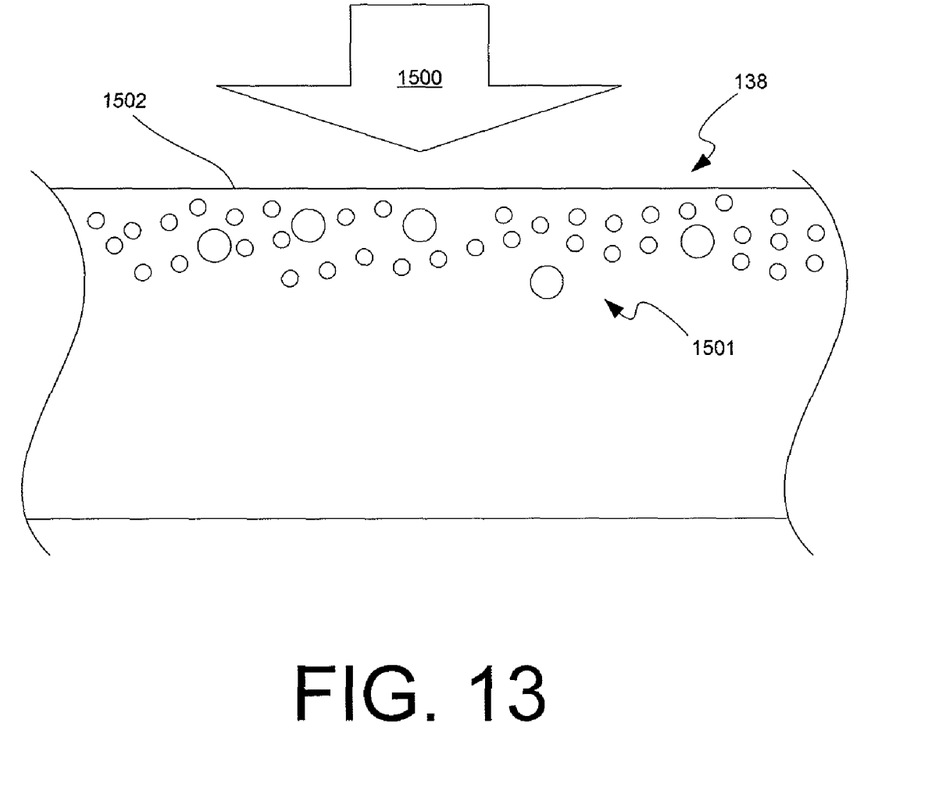
FIG. 13 is a workpiece that has been implanted with an inert gas.

Implanting with an inert gas, such as H or a noble gas, may cause microbubbles in the workpiece. FIG. 13 is a workpiece that has been implanted with an inert gas. A species 1500, such as H or a noble gas, is implanted into a workpiece 138. Microbubbles 1501, or microcavities, form near the surface of the workpiece 138. The depth of the microbubbles 1501 or range of the microbubbles 1501 may be adjusted by altering parameters of the implant, such as implant energy or implant dose. Due to the presence of the microbubbles 1501 at a high dose near the surface 1502, the surface 1502 of the workpiece 138 may be brittle or porous, which may affect the CMP process. In other embodiments where the species 1500 is implanted at a lower dose, the metal atoms in the workpiece 138 will diffuse to heal any defects in the workpiece 138, such as microbubbles 1501. Thus, the microbubbles 1501 will be absorbed or broken before the CMP process and the species 1500 will be incorporated into the lattice of the workpiece 138. It also may be possible to heat the workpiece 138 and cause the species 1500 to diffuse out of the workpiece 138.

In yet another instance, embodiments of this ion implantation method may be applied to polishing a cleaved workpieces or to a 3D IC or stacked chip. Such a workpiece may have been implanted with, for example, hydrogen or helium to form microbubbles prior to cleaving. After cleaving, the formed surface is rough and requires polishing during a CMP process. An implant will at least affect dishing, erosion, and polishing rates of the CMP process.

FIGS. 14A-14E are cross-sectional views of an embodiment of cleaving. Implantation prior to or during a CMP process is applicable to workpieces that require a cleaving implant, such as 3D IC or stacked chip configurations. This process also may be applicable to the fabrication of workpieces that are used in, for example, flat panels, thin films, solar cells, LEDs, other thin metal sheets, or other devices. The workpiece that is cleaved using this process may be, for example, silicon, SiC, GaN, GaP, GaAs, polysilicon, Ge, quartz, or other materials.

Figure 14:
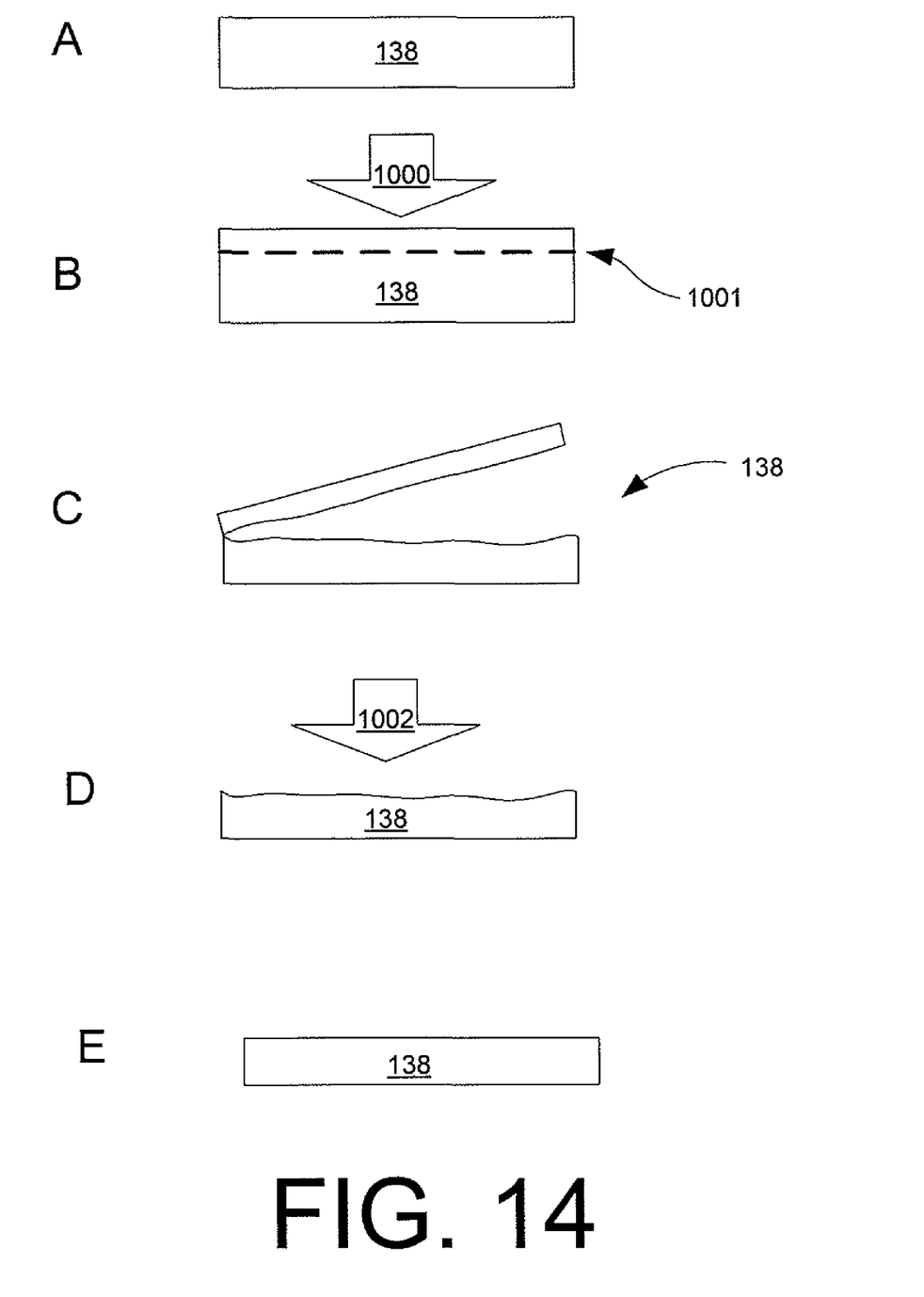
FIGS. 14A-14E are cross-sectional views of an embodiment of cleaving.
Figure 15:
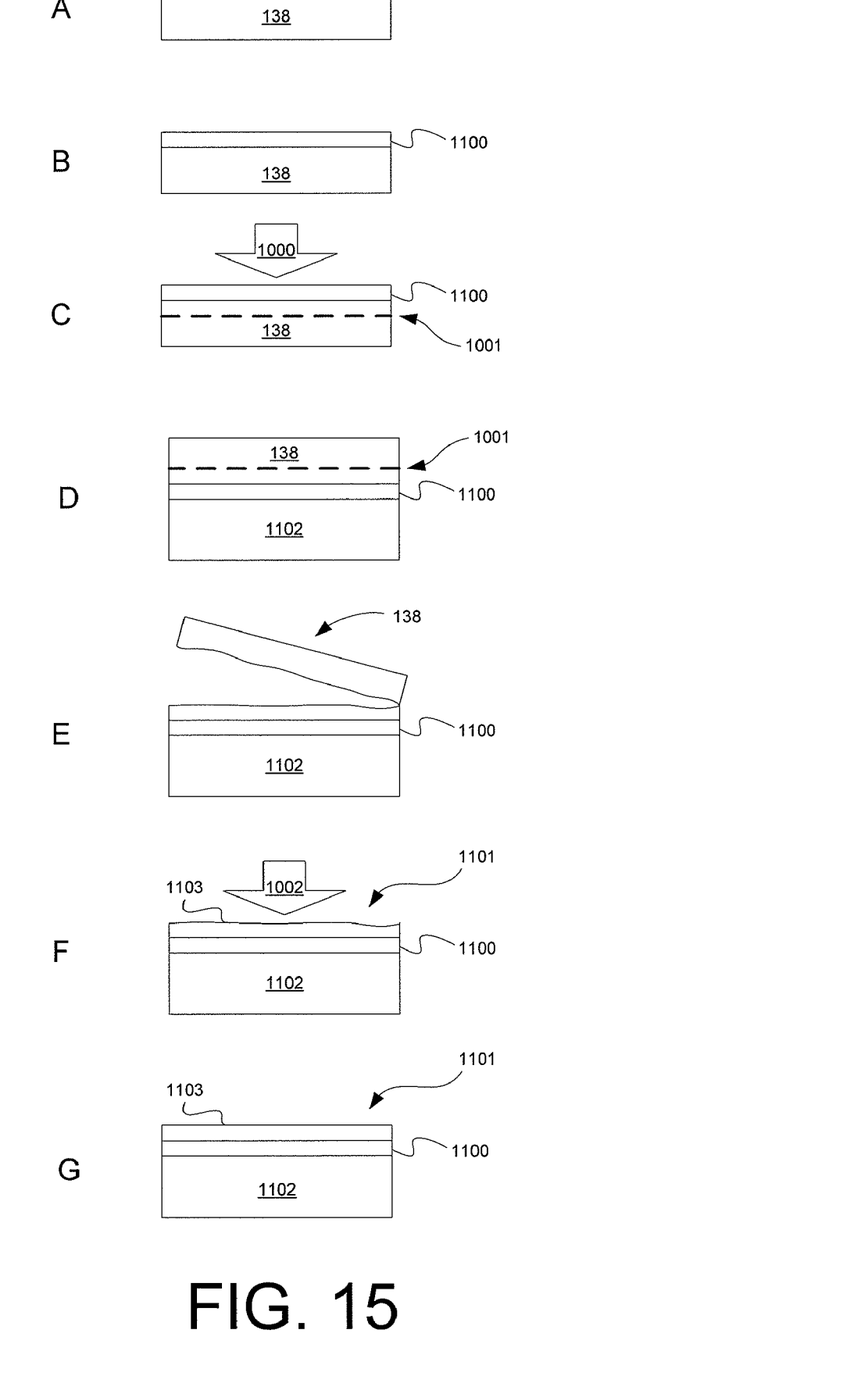
FIGS. 15A-15G are cross-sectional views of an embodiment of silicon-on-insulator (SOI) wafer fabrication.

In fabricating a cleaved workpiece, a workpiece 138 is provided (A). The workpiece 138 may be referred to as a donor wafer. At least one species 1000, such as hydrogen or helium, for example, is implanted into the workpiece 138 to form a layer of microbubbles 1001 (B). During an anneal or another thermal process, the workpiece 138 fractures or cleaves along the layer of microbubbles 1001 (C). In another embodiment, a mechanical, chemical, or fluid force is used to fracture or cleave the workpiece 138 along the layer of microbubbles 1001. The remaining workpiece 138 that is cleaved off may be reused in some embodiments. In another particular embodiment, the workpiece 138 is bonded to another workpiece prior to fracturing or cleaving the workpiece 138 along the layer of microbubbles 1001.

Either side of the cleaved workpiece 138 is then implanted with a second species 1002 (D). This second species 1002, which may be the same as the species 1000, will control the effects of the CMP process on the cleaved workpiece 138. The cleaved workpiece 138 is then polished in a CMP process to make the surface smooth enough for device manufacture (E). The implant of the second species 1002 will at least affect dishing, erosion, and polishing rates of the CMP process.

FIGS. 15A-15G are cross-sectional views of an embodiment of SOI wafer fabrication. SOI wafer fabrication may be improved by implanting a species prior to or during a CMP process. Embodiments of this implantation method may be applied to other embodiments of SOI wafer fabrication and is not limited solely to the method illustrated in FIG. 15.

In fabricating an SOI wafer, a workpiece 138 is provided (A). The workpiece 138 may be referred to as a donor wafer. The workpiece 138 has a thermal oxide layer 1100 formed on at least one surface (B). At least one species 1000, such as hydrogen or helium, for example, is implanted into the workpiece 138 to form a layer of microbubbles 1001 (C). This workpiece 138 is then flipped over, bonded to a handle wafer 1102, and annealed (D). In some embodiments, the workpiece 138 is cleaned prior to bonding it to the handle wafer 1102. During the anneal or another thermal process, the workpiece 138 fractures or cleaves along the layer of microbubbles 1001 (E). In another embodiment, a mechanical, chemical, or fluid force is used to fracture or cleave the workpiece 138 along the layer of microbubbles 1001. The remaining workpiece 138 that is cleaved off may be reused in some embodiments.

The overlayer 1103 of the SOI wafer 1101 is then implanted with a second species 1002 (F). This second species 1002, which may be the same as species 1000, will control the effects of the CMP process on the overlayer 1103. The formed SOI wafer 1101, including the thermal oxide layer 1100 and overlayer 1103, is then polished in a CMP process to make the surface smooth enough for device manufacture (G). The implant of the second species 1002 will at least affect dishing, erosion, and polishing rates of the CMP process.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method comprising:
   depositing a metal on a surface of a workpiece;
   amorphizing at least a portion of said metal by implanting a species into said metal, a first point on said surface and a second point on said surface receiving different doses of said species;
   wherein said first point is a center region and said second point is an edge region;
   wherein said center region has a first dose and said edge region has a second dose, said first dose being higher than said second dose; and
   performing a chemical mechanical polish on an exposed surface of said metal.

2. The method of claim 1, wherein said metal is selected from the group consisting of copper and tungsten.

3. The method of claim 1, wherein said species is selected from the group consisting of Si, Ge, As, B, P, H, He, Ne, Ar, Kr, Xe, and C.

4. The method of claim 1, wherein said method further comprises controlling electromigration in said metal by said amorphizing.

5. The method of claim 1, wherein said method further comprises controlling adhesion of said metal with a first layer by said amorphizing.

6. The method of claim 1, wherein said amorphizing occurs prior to said chemical mechanical polish.

7. The method of claim 1, further comprising removing overburden of said metal on said workpiece.

8. The method of claim 7, wherein said amorphizing occurs after said removing but prior to said chemical mechanical polish.

9. A method comprising:
   depositing a layer on a surface of a workpiece;
   implanting at least a portion of said layer with a species, a first point on said surface and a second point on said surface receiving different doses of said species;
   wherein said first point is a center region and said second point is an edge region;
   wherein said center region has a first dose and said edge region has a second dose, said first dose being higher than said second dose; and
   performing a chemical mechanical polish on an exposed surface of said layer.

10. The method of claim 9, wherein said layer is selected from the group consisting of a dielectric and a crystal.

11. The method of claim 9, wherein said species is selected from the group consisting of Si, Ge, As, B, P, H, He, Ne, Ar, Kr, Xe, and C.

12. A method comprising:
   implanting a workpiece with a first species to form a layer of microbubbles in said workpiece;
   cleaving said workpiece along said layer of microbubbles to form a cleaved surface;
   implanting at least a portion of said cleaved surface with a second species selected from the group consisting of Si, Ge, As, B, P, H, He, Ne, Ar, Kr, Xe and C; and
   performing a chemical mechanical polish on said cleaved surface.

13. The method of claim 12, wherein said workpiece said implanting with said second species comprises implanting a first point on said cleaved surface and a second point on said cleaved surface with different doses of said second species.

14. The method of claim 13, wherein said first point is a center region and said second point is an edge region.

15. The method of claim 14, wherein said center region has a first dose and said edge region has a second dose, said first dose being higher than said second dose.

* * * * *